(12) United States Patent
Mitchell et al.

(10) Patent No.: US 8,691,064 B2
(45) Date of Patent: Apr. 8, 2014

(54) SPUTTER-ENHANCED EVAPORATIVE DEPOSITION APPARATUS AND METHOD

(75) Inventors: Daniel B. Mitchell, Port McNicoll (CA); Geoffrey G Harris, Midland (CA)

(73) Assignee: Raytheon Canada Limited, Ottawa (CA)

( * ) Notice: Subject to any disclaimer, the term of this patent is extended or adjusted under 35 U.S.C. 154(b) by 1431 days.

(21) Appl. No.: 11/825,733

(22) Filed: Jul. 9, 2007

(65) Prior Publication Data

US 2009/0014316 A1 Jan. 15, 2009

(51) Int. Cl.
*C23C 14/34* (2006.01)

(52) U.S. Cl.
USPC ........... 204/298.26; 204/298.04; 427/566; 118/726; 118/723 V

(58) Field of Classification Search
USPC ............ 118/726, 723 VE; 427/566, 126.3; 204/298.26, 298.04
See application file for complete search history.

(56) References Cited

U.S. PATENT DOCUMENTS

| | | | |
|---|---|---|---|
| 3,437,734 A * | 4/1969 | Roman et al. ............ 373/14 |
| 5,346,600 A * | 9/1994 | Nieh et al. ............ 204/192.3 |
| 5,431,794 A | 7/1995 | Matsumaru et al. |
| 6,616,818 B2 | 9/2003 | Gibson |
| 6,846,517 B2 | 1/2005 | Chang et al. |
| 6,849,085 B2 | 2/2005 | Marton |
| 2001/0032782 A1 * | 10/2001 | Vanden Brande et al. ............ 204/192.12 |
| 2003/0217914 A1 * | 11/2003 | Miller et al. ............ 204/192.12 |
| 2004/0258851 A1 | 12/2004 | Selvamanickam et al. |
| 2005/0165468 A1 | 7/2005 | Marton |

FOREIGN PATENT DOCUMENTS

JP 55094473 A * 7/1980

* cited by examiner

*Primary Examiner* — Keith Hendricks
*Assistant Examiner* — Jason M Berman
(74) *Attorney, Agent, or Firm* — Lando & Anastasi, LLP

(57) ABSTRACT

A deposition apparatus includes a deposition source that produces a deposition flow of a deposited material and has an evaporation source with a material to be deposited therein, and a sputtering source that produces sputtering ions directed at the material to be deposited in the evaporation source. A deposition target is in facing relationship to the deposition source. The sputtering source is operated simultaneously with the evaporation source.

17 Claims, 2 Drawing Sheets

SPUTTER-ENHANCED EVAPORATIVE DEPOSITION APPARATUS AND METHOD

This invention relates to the deposition of material from a deposition source onto a substrate and, more particularly, to such deposition that energizes an evaporative deposition source with a sputtering current.

BACKGROUND OF THE INVENTION

Thin films of various materials are deposited onto deposition substrates for a variety of applications. For example, thin films are used in electronic and optical devices. The thin films may include only a single layer or may include multiple layers. Materials that may be deposited include metals, semiconductors, and insulators.

The thin films are formed by supplying a substrate, and then depositing the thin-film material from a source onto the substrate. A variety of sources are known, and the various sources have differing characteristics as to the materials that may be deposited, the deposition rates, the character of the deposit that forms the thin film, and other properties.

The deposited thin film may also be processed to modify its properties, either simultaneously with the deposition or after the deposition is complete. For example, the surface of the deposited thin film may be bombarded with energetic ions different from the deposited material. This bombardment modifies the density of the deposited material and may also alter other properties such as electronic properties. This approach to deposit modification may also alter the chemistry of the deposited thin film as a result of ion implantation into its surface. The resulting deposited-and-bombarded thin film may have both undesirably modified physical properties and also undesirably modified chemical properties, in each case different from that required for the application.

There is a need for an improved approach to the deposition and processing of a thin film, that allows the physical properties of the deposited thin film to be modified without adversely affecting the chemical composition of the thin film. The present invention fulfills this need, and further provides related advantages.

SUMMARY OF THE INVENTION

The present invention provides a deposition apparatus and method for depositing a thin film onto a deposition substrate. The properties of the thin film may be controlled and/or modified as the deposition progresses, without changing the chemistry of the deposited thin film.

In accordance with the invention, a deposition apparatus is operable to deposit a material to be deposited on a deposition target. The deposition apparatus comprises a deposition source that produces a deposition flow of a deposited material. The deposition source comprises an evaporation source that receives therein the material to be deposited, and a sputtering source operable to produce sputtering ions directed at the material to be deposited in the evaporation source, while the evaporation source is operated. The deposition apparatus preferably further includes a deposition target in facing relationship to the deposition source. The sputtering source is preferably an ion beam sputtering source.

Preferably, the deposition apparatus further includes a vacuum enclosure having an interior in which the deposition source and the deposition target are received, and a vacuum pump operable to evacuate the interior of the vacuum enclosure.

There may be an adjustable evaporation power source for the evaporation source, and an adjustable sputtering power source for the sputtering source. The adjustable evaporation power source and the adjustable sputtering power source are adjustable independently of each other.

The deposition apparatus may include a magnetic confinement coil positioned to direct the material to be deposited toward the substrate after it leaves the evaporation source.

The deposition apparatus may include a biasing power supply that electrically biases the evaporation source relative to the deposition substrate.

The deposition apparatus may also include a bombardment source that adds energy to a surface of the deposition substrate separately from the energy provided by the material deposited.

A method for depositing a material on a deposition target comprises the steps of providing a deposition source that contains a material to be deposited and produces therefrom a deposition flow of the material to be deposited. The deposition source comprises an evaporation source having therein the material to be deposited, and a sputtering source that produces sputtering ions. A deposition target is provided in facing relationship to the deposition source. The evaporation source is operated to evaporate the deposited material. Simultaneously, the sputtering source is operated to sputter ions of the material to be deposited from the evaporation source so as to deposit upon the deposition target. Other compatible features discussed herein may be used with this embodiment.

In evaporation deposition, the material to be deposited is contained in a crucible and is heated by a technique such as resistance heating or electron bombardment. The material to be deposited is melted, and atoms leave the surface of the melt in a relatively high volume but at a relatively low energy. The evaporated atoms deposit upon the substrate surface, contributing their relatively low energy to the substrate. A plasma-assist or ion-assist approach may be used to add additional energy directly to the surface of the deposited layer to improve the physical properties of the deposited layer. However, the plasma assist or ion assist also contributes, and may result in the implantation of, energetic foreign atoms, such as argon atoms, in the deposited layer. The implanted foreign atoms alter the chemical composition and structure of the deposited layer and potentially degrade its electronic or optical quality.

The present approach adds energy to the surface of the deposited layer by increasing the energy level of at least some of the atoms leaving the evaporation source. A fraction of the atoms of the material to be deposited are sputtered from the surface of the evaporation source, rather than being evaporated. The sputtered atoms are of higher energy than the evaporated atoms, so that the average energy of the atoms reaching the deposition target is higher than that of evaporated atoms alone.

The relative amounts of lower-energy and higher-energy atoms leaving the evaporation source and reaching the deposition substrate may be adjusted by altering the relative voltage and current flow of the sputtering source. The operator therefore can alter the average energy level of the deposited material over a range.

The present approach has the important advantage over plasma-assisted deposition, ion-assisted deposition, and related approaches, which add energy directly to the surface of the deposited layer, that no foreign atoms are introduced into the deposited layer. The sputtering process of the present approach uses ions to sputter atoms from the surface of the deposition material in the evaporation source, but the sputtering ions do not then flow to or otherwise reach the deposited layer. There increased-energy atoms reaching the deposited layer are the intended deposition material, not energetic ions of a foreign species. Consequently, the present approach achieves the advantages of plasma-assisted and ion-assisted deposition, without the disadvantage of adding foreign ions to the deposited layer. The present approach also achieves better utilization of energy and cooling power in the deposition source. A fraction of the energy introduced into the evaporation source by the sputtering source is transferred to the deposition substrate, rather than requiring additional cooling power in the deposition source.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
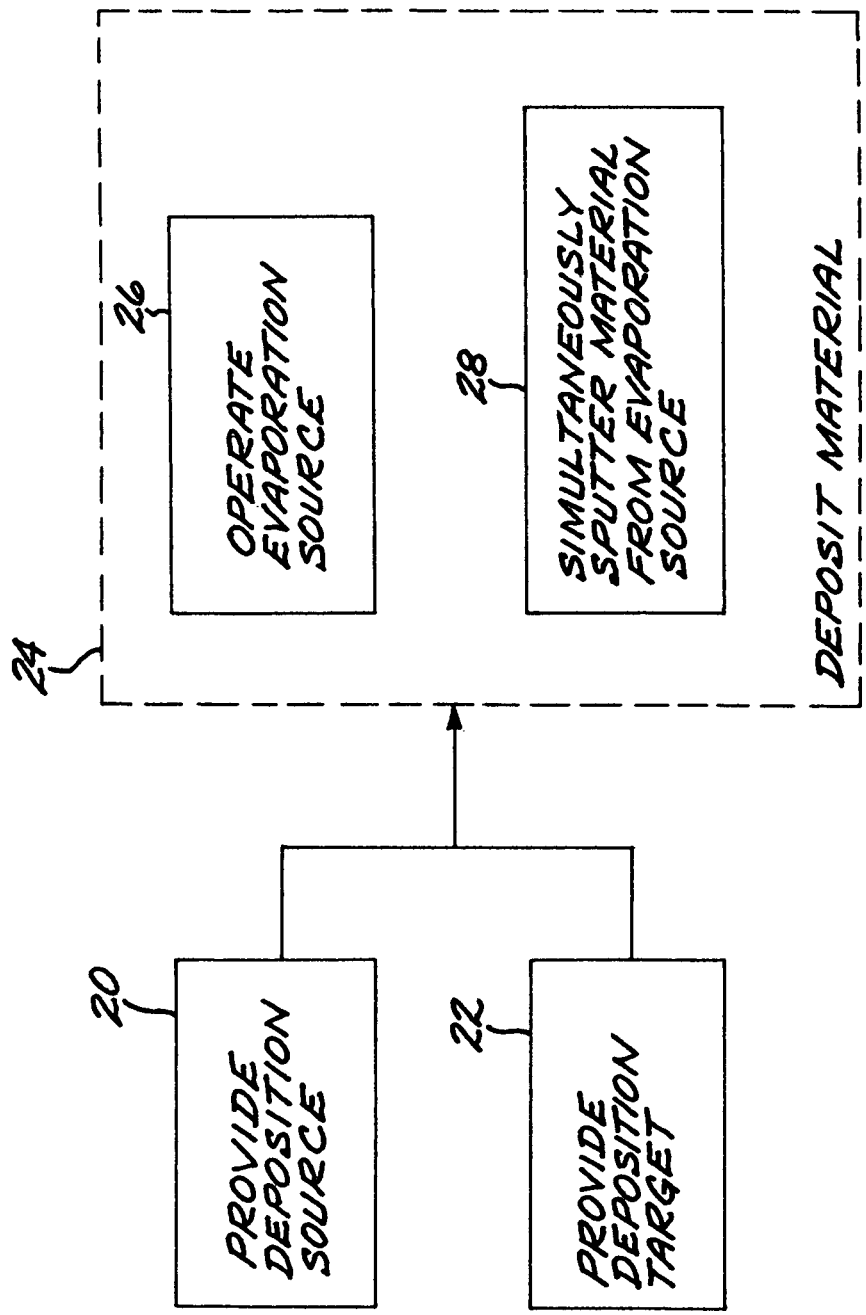
FIG. 1 is a block flow diagram of a method for depositing a material on a substrate.

FIG. 1 depicts the steps of a method for depositing a material on a substrate. A deposition source is provided, step 20, and a deposition target is provided, step 22.

Figure 2:
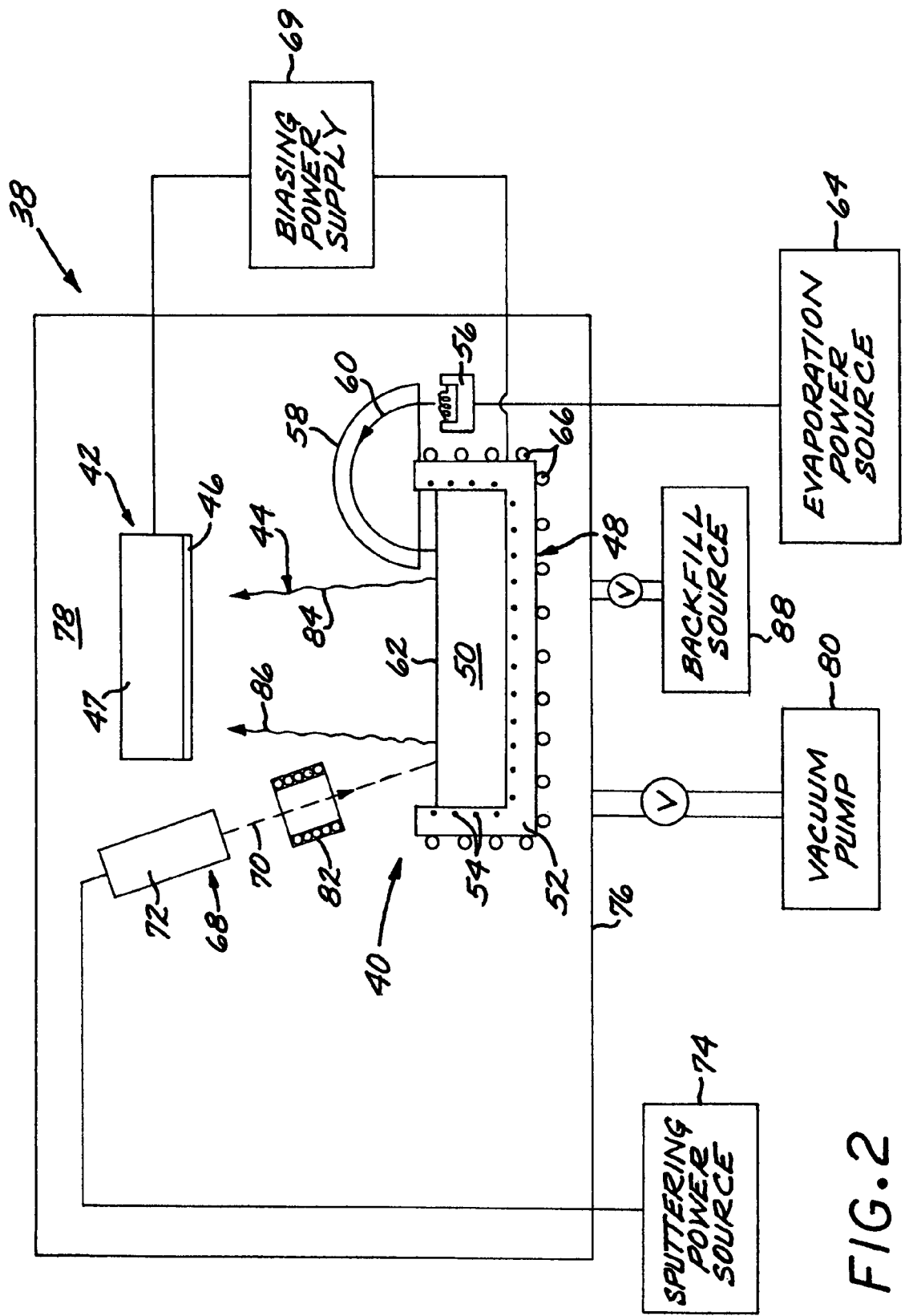
FIG. 2 is a schematic view of an embodiment of a deposition apparatus useful in the method of FIG. 1.

FIG. 2 illustrates a preferred embodiment of a deposition apparatus 38 including the deposition source 40 and the deposition target 42 that is in a generally facing relation to the deposition source 40. The deposition source 40 produces a deposition flow 44 of a material to be deposited as a layer 46 of a deposited material on a deposition substrate 47. The deposition substrate 47 is part of the deposition target 42 and is in a generally facing relationship to the deposition source 40.

The deposition source 40 comprises an evaporation source 48 containing therein the material 50 to be deposited. The evaporation source 48 includes a crucible 52 in which is held the material 50 to be deposited. The crucible 52 is heated by any operable approach (other than sputtering) to cause the material 50 to be evaporated. A wide range of materials 50 may be evaporated and deposited, including both metals and nonmetals such as semiconductors and insulators. Two heating techniques of most interest are electrical-resistance thermal heating, indicated by resistance heating wires 54, and electron-beam heating, indicated by an electron gun 56 and an electrical-field source 58 that directs the electron flow 60 produced by the electron gun 56 onto an upper surface 62 of the material 50 to be evaporated. The electron gun 56 is powered by an adjustable and controllable evaporation power source 64. Other heating techniques, such as induction heating, may also be used. In most cases, only one heating technique is used, but resistance heating and electron-beam heating are shown in FIG. 2 for illustration. The crucible 52 may made of a ceramic material, or, optionally, it may be made of a metal and cooled, as by cooling coils 66. Optionally, the evaporation source 48 and the deposition target 42 may be electrically biased relative to each other by a biasing power supply 69.

The deposition apparatus 38 further includes a sputtering source 68 that produces sputtering ions 70 directed at the material 50 to be deposited in the evaporation source 48, while the evaporation source 48 is operated. The sputtering source 68 may be of any operable type, but an ion beam sputtering source 72 is preferred. The sputtering source 72 is preferably oriented and/or positioned so that its sputtering ions 70 cannot be directly incident upon the deposition target 42 and its layer of deposited material 46. The ion beam sputtering source 72 produces a current of the sputtering ions 70 and directs them at the upper surface 62 of the material 50 to be evaporated, while it is within the crucible 52 of the evaporation source 48. The sputtering source 68 is powered by an adjustable sputtering power source 74. The adjustable evaporation power source 64 and the adjustable sputtering power source 74 are adjustable independently of each other.

The deposition apparatus also preferably includes a vacuum enclosure 76 having an interior 78 in which the deposition source 40, the deposition target 42, and the sputtering source 68 are received. A vacuum pump 80 is operable to evacuate the interior 78 of the vacuum enclosure 76. The interior 78 of the vacuum enclosure 76 may be controllably backfilled with a gas from a backfill source 88, depending upon the specific material 50 to be deposited.

Optionally but preferably, a magnetic confinement coil 82 is positioned to direct the beam of sputtering ions 70 toward a desired portion of the surface 62 of the material 50 to be deposited while it is within the evaporation source 48. The magnetic confinement coil 82 may be positioned directly adjacent to the beam of sputtering ions 70, or at a distance therefrom but positioned so that the magnetic field of the magnetic confinement coil 82 can interact with the beam of sputtering ions 70.

Returning to the method depicted in FIG. 1, the deposition apparatus 38 is operated, step 24, to deposit the material 50 to be deposited onto the deposition substrate 47 to first create and then thicken the layer 46 of deposited material. In this operation 24, the evaporation source 48 is operated, step 26, to evaporate the material 50, in the manner described earlier. Simultaneously, the sputtering source 68 is operated, step 28, to direct the beam of sputtering ions 70 at the material 50 to be deposited that is within the evaporation source 48.

The deposition flow 44 of material to be deposited is comprised of two distinct portions, an evaporation flow 84 produced by the evaporation process and a sputtering flow 86 produced by the sputtering process, of the same material originating from the same upper surface 62 of the material 50 to be deposited. In the usual case, the mass flow rate of the evaporation flow 84 is greater than the mass flow rate of the sputtering flow 86, although both atom flows 84 and 86 are of the same material 50 to be deposited. The energy of the individual atoms of the evaporation flow 84 is less than the energy of the individual atoms of the sputtering flow 86, due to the manner of ejection from the upper surface 62 of the atoms as a result of the two mechanisms. The larger the proportion of the deposition flow 44 that is the sputtering flow 86, the greater is the average energy of the atoms reaching the deposition target 42. Consequently, by using the adjustable sputtering power source 74 to control the ion beam sputtering source 72 to adjust the current and voltage of the sputtering ions 70 whose impingement upon the upper surface 62 produces the sputtering flow 86, the average energy of the atoms reaching the deposition target 42 may be readily controlled. Unlike plasma-assist and ion-assist techniques wherein energy is applied through impinging foreign atoms or ions directly to the deposition target 42, in the present approach no foreign atoms or ions reach, and are possibly introduced into, the layer 46 of deposited material. The risk of chemical contamination and physical disruption by such foreign atoms or ions is thereby avoided.

Unlike the use of separate evaporation and sputtering sources, the upper surface 62 from which sputtering occurs is preheated by the evaporation energy source (54 or 56), and the upper surface 62 from which evaporation occurs is preheated by the sputtering source 72. The surface shape of the upper surface 62 is therefore improved, particularly for the case of the resistively heated evaporation source, leading to a more uniform distribution on the deposition target 42. A more efficient use of the input power is thereby achieved, reducing the cooling requirements. Additionally, the evaporation flow 84 and the sputtering flow 86 originate from approximately the same location of the single evaporation source 48, so that the distribution of the deposited atoms is approximately the same.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A deposition apparatus operable to deposit a material to be deposited on a deposition target, the deposition apparatus comprising:
    a deposition source that produces a deposition flow including an evaporation flow of the material to be deposited and a sputtering flow of the material to be deposited, the deposition source comprising:
        an evaporation source including a crucible that receives therein the material to be deposited, the evaporation source configured to heat the material to be deposited in the crucible to produce the evaporation flow of the material to be deposited, and
        an ion beam sputtering source operable to produce and direct ions at the material to be deposited in the crucible such that the ions eject a portion of the material to be deposited from the crucible to produce the sputtering flow of the material to be deposited, while the evaporation source is operated.

2. The deposition apparatus of claim 1, wherein the evaporation source is a thermal evaporation source.

3. The deposition apparatus of claim 1, wherein the evaporation source is an electron beam evaporation source.

4. The deposition apparatus of claim 1, further including
    a vacuum enclosure having an interior in which the deposition source is received, and
    a vacuum pump operable to evacuate the interior of the vacuum enclosure.

5. The deposition apparatus of claim 1, further including
    an adjustable evaporation power source for the evaporation source, and
    an adjustable sputtering power source for the ion beam sputtering source, wherein the adjustable evaporation power source and the adjustable sputtering power source are adjustable independently of each other.

6. The deposition apparatus of claim 1, further including a magnetic confinement coil positioned to direct the ions toward the material to be deposited while it is within the crucible.

7. The deposition apparatus of claim 1, further including the material to be deposited, and wherein the material to be deposited is a metal, a semiconductor, or an insulator.

8. The deposition apparatus of claim 1, further including a deposition target in facing relationship to the deposition source.

9. The deposition apparatus of claim 1, further including
    a deposition target in facing relationship to the deposition source, and
    a biasing power supply that electrically biases the evaporation source relative to the deposition target.

10. A deposition apparatus operable to deposit a material to be deposited, the deposition apparatus comprising:
    a deposition source that produces a deposition flow including an evaporation flow of the material to be deposited and a sputtering flow of the material to be deposited, the deposition source comprising:
        an evaporation source including a crucible that receives therein the material to be deposited, the evaporation source configured to heat the material to be deposited in the crucible to produce the evaporation flow of the material to be deposited; and
        an ion beam sputtering source that produces and directs ions at the material to be deposited in the crucible such that the ions eject a portion of the material to be deposited from the crucible to produce the sputtering flow of the material to be deposited while the evaporation source is operated;
    a deposition target in facing relationship to the deposition source;
    an adjustable evaporation power source for the evaporation source;
    an adjustable sputtering power source for the ion beam sputtering source, wherein the adjustable evaporation power source and the adjustable sputtering power source are adjustable independently of each other;
    a vacuum enclosure having an interior in which the deposition source and the deposition target are received; and
    a vacuum pump operable to evacuate the interior of the vacuum enclosure.

11. The deposition apparatus of claim 10, wherein the evaporation source is a thermal evaporation source.

12. The deposition apparatus of claim 10, wherein the evaporation source is an electron beam evaporation source.

13. The deposition apparatus of claim 10, further including
    a magnetic confinement coil positioned to direct the ions toward the material to be deposited while it is within the crucible.

14. The deposition apparatus of claim 10, further including
    a biasing power supply that electrically biases the evaporation source relative to the deposition target.

15. A method for depositing a material on a deposition target, comprising the steps of
    providing a deposition target;
    providing a deposition source that contains a material to be deposited and produces therefrom a deposition flow of the material to be deposited to the deposition target, the deposition flow including an evaporation flow of the material to be deposited and a sputtering flow of the material to be deposited, the deposition source comprising:
        an evaporation source including a crucible having therein the material to be deposited, and
        an ion beam sputtering source that produces ions;
    positioning the deposition target to be in a facing relationship to the deposition source;
    operating the evaporation source to evaporate the material to be deposited in the crucible to produce the evaporation flow from the crucible to the deposition target; and
    simultaneously operating the ion beam sputtering source, to direct the ions at the material to be deposited in the crucible to eject a portion of the material to be deposited to produce the sputtering flow from the crucible to the deposition target.

16. The method of claim 15, wherein operating the ion beam sputtering source includes adjusting the power of the ion beam sputtering source to control the average energy of the sputtering flow incident upon the deposition target.

17. The method of claim 15, wherein operating the ion beam sputtering source includes positioning the sputtering source so that the ions do not reach the deposition target.

* * * * *